PRODUCTION OF INFRARED DETECTOR PATTERNS
Filed Sept. 28, 1964
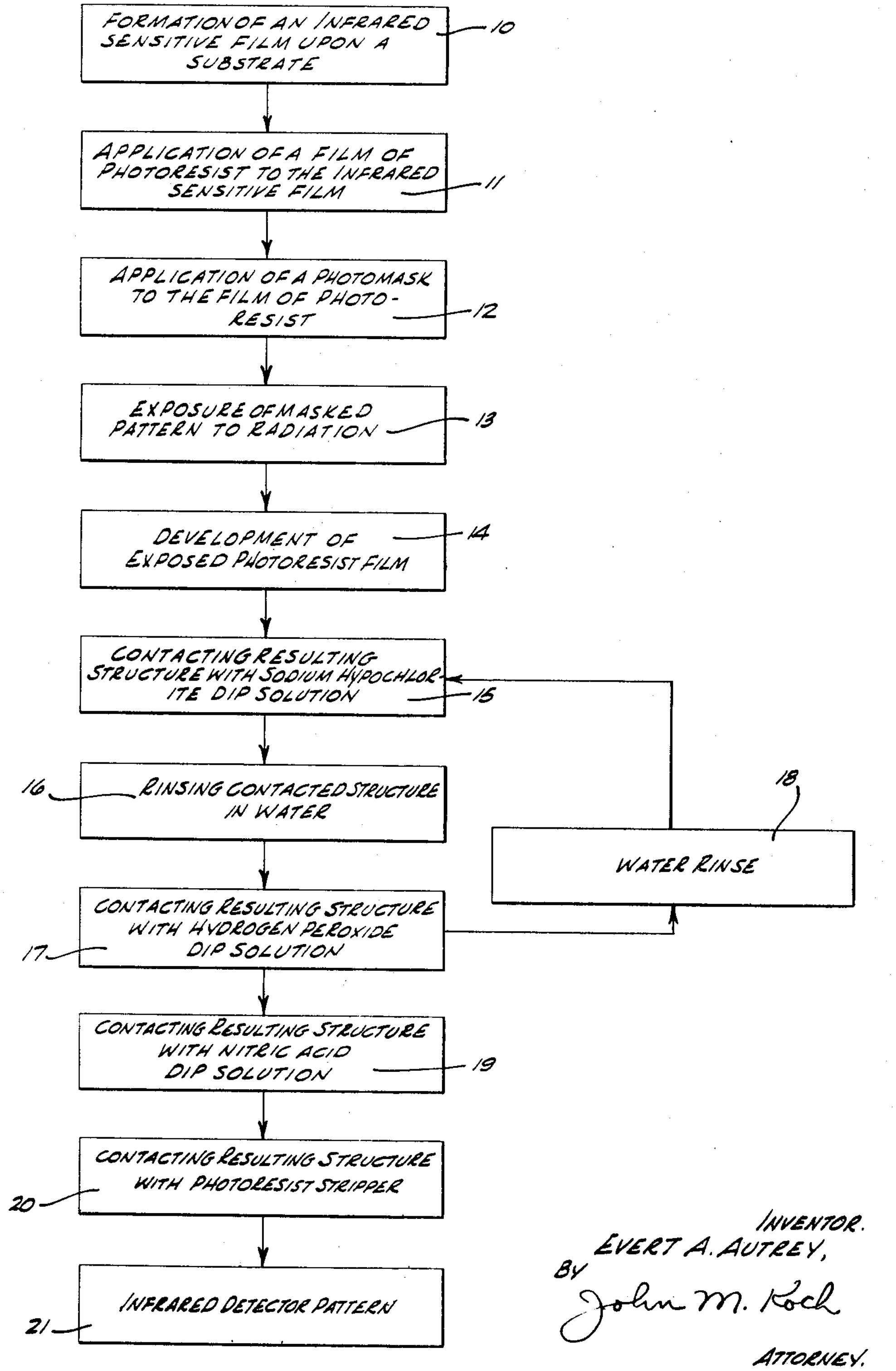
INVENTOR.
EVERT A. AUTREY,
BY John M. Koch
ATTORNEY.

United States Patent Office 3,356,500
Patented Dec. 5, 1967

3,356,500
PRODUCTION OF INFRARED DETECTOR PATTERNS

Evert A. Autrey, Santa Barbara, Calif., assignor to Santa Barbara Research Center, Goleta, Calif., a corporation of California Filed Sept. 28, 1964, Ser. No. 399,590
3 Claims. (Cl. 96—36)

This invention relates to a method for delineating detector film areas of lead selenide and lead sulfide, and especially to delineating such film areas for complex detector array patterns.

Chemically deposited lead selenide and lead sulfide films possess highly desirable properties for use in detecting near infrared radiation. To obtain maximum information and enhance background discrimination in the use of such detectors, it is necessary to form the infrared detector films in the form of complex or intricate array patterns. A prior art method employed for delineating film areas for such infrared detectors involves varnishing a suitable intricate mask on a substrate before deposition of a lead selenide or lead sulfide film thereon and subsequently removing the intricately formed film of varnish mask with the unwanted film of lead selenide or lead sulfide attached thereto. This prior art method suffers from the disadvantage that, due to the physical characteristics of the varnish film mask, it is difficult to apply the varnish film mask in the form of intricate patterns. Furthermore, the presence of varnish is undesirable in the lead selenide or lead sulfide deposition bath.

Other prior art methods involve sandblasting and scribing techniques. These latter methods often result in the production of ragged edges on the lead selenide or lead sulfide detector pattern. Such ragged edges tend to introduce electrical noise in the detected infrared signals. In addition, sandblasting and scribing techniques damage the detector pattern substrate and make it a difficult matter to accurately or precisely produce intricate lead selenide or lead sulfide detector patterns.

Accordingly, it is a primary object of this invention to provide a method for accurately and precisely producing lead selenide or lead sulfide detectors in the form of intricate patterns.

Another object of this invention is to provide a method for accurately and efficiently producing intricate arrays of lead selenide or lead sulfide detector films having low electrical noise characteristics.

Additional objects of this invention will become apparent from the following description, which is given primarily for purposes of illustration, and not limitation.

Stated in general terms, the objects of this invention are attained by forming an infrared sensitive film of lead selenide or lead sulfide upon a substrate, establishing a photoresist pattern on the lead selenide or lead sulfide layer and etching away the unwanted lead selenide, or lead sulfide, in areas not protected by the resist pattern, by the consecutive use of a hypochlorite solution and a peroxide solution.

A more detailed description of a specific embodiment of this invention, as applied to a lead selenide detector, is given below with reference to the accompanying drawing, which is a flow sheet schematically showing the method of the invention.

The desired complex or intricate pattern of lead selenide film is produced by first forming an infrared sensitive film of lead selenide upon a substrate, as indicated at 10, coating the film with a photoresist, as indicated at 11, of a type well known in the art. A photomask having clear and opaque areas in the desired pattern is held in contact with the photoresist layer, as indicated at 12, and the combination is exposed to ultraviolet radiation, as indicated at 13, to modify the photoresist in areas of the pattern. The photoresist is then developed, as indicated at 14, to yield a coating which protects the predetermined lead selenide areas from the etching solution.

The lead selenide detector film pattern, or array, not protected by the photoresist is removed by alternately contacting, by dipping, the pattern and substrate with an aqueous solution containing about 5% sodium hypochlorite, as indicated at 15, rinsing in water as indicated at 16, and then contacting, by dipping, with a solution containing about 30% hydrogen peroxide, as indicated at 17. A water rinsing step 18 is inserted between steps 17 and 16. It is understood that other aqueous solutions of hypochlorite, such as potassium hypochlorite, for example, can be used, and that other aqueous solutions of peroxides can be used. The substrate is rinsed between dips. The chemically converted lead selenide film turns a brownish yellow color after about five or six such alternate dippings in the hypochlorite and peroxide solutions. This colored layer then is removed from the desired pattern by a quick dip in about 10% nitric acid, as indicated at 19, and the desired infrared detector pattern 21 is produced by removing the remaining photoresist layer by dipping the resulting structure in any of the well known resist strippers, as indicated at 20.

The action of the hypochlorite is very slow at a pH of less than 4.0, and the action is too vigorous for adequate control at a pH of above 9.0. The preferred pH range is about 7.5–8.0.

The etch does not disturb gold electrode patterns which therefore may be applied to the substrate before deposition of the lead selenide. This order of applying layers to the substrate has the advantage that electrode spacing and orientation may be established and tested before the sensitive layer is deposited. If desired, the electrodes may be applied after delineation of the lead selenide.

The above-described procedure is rapid and is easily performed. The patterns produced are very clean and sharp and free of ragged edges. Line widths are precisely determined and are accurate to within about 0.0002 inch. Polycrystalline substrates, which cannot be scribed, are used with the method of the invention.

By using the method of the invention one can define any desired pattern with extreme accuracy and precision. The chemicals employed remove the extraneous lead selenide rapidly and neatly without destroying the photoresist.

Lead sulfide infrared detector patterns also can be made by the use of the method of the invention. In the case of lead sulfide, the same techniques described above in connection with lead selenide, are used, except that the final nitric acid solution dip need not be used because the converted lead sulfide residue washes away with water. Although lead sulfide films, unlike lead selenide films, can be etched away readily while using common solutions, such as strong acids, for example, it has been found that etching, while using the techniques of this invention, results in better defined patterns, with less undercutting, than when acid etchants are used.

Obviously many other modifications and variations of the present invention are possible in the light of the above teachings. It is therefore to be understood that within the scope of the appended claims the invention can be practiced otherwise than as specifically described.

What is claimed is:

1. A method for the production of infrared detector patterns of infrared sensitive material selected from the group consisting of lead selenide and lead sulfide which comprises the steps of applying a film of the infrared sensitive material to a substrate, applying a photoresist layer to the exposed infrared sensitive film, applying a photomask having clear and opaque areas of the desired pattern to the photoresist layer, exposing the resulting structure to radiation through the photomask to modify the photoresist layer in clear areas of the pattern, developing the photoresist to produce a coating to protect the predetermined infrared sensitive pattern from etching solutions, removing the infrared sensitive film not protected by photoresist by alternately dipping the resulting structure in an aqueous solution of hypochlorite and an aqueous solution of peroxide, removing the chemically converted infrared sensitive film not protected by photoresist, and removing the remaining protective layer of photoresist from the resulting structure to produce the desired infrared detector pattern.

2. A method for the production of infrared detector patterns of lead selenide which comprises the steps of applying a film of lead selenide to a substrate, applying a photoresist layer to the exposed lead selenide film, applying a photomask having clear and opaque areas of the desired pattern to the photoresist layer, exposing the resulting structure to radiation through the photomask to modify the photoresist layer in clear areas of the pattern, developing the photoresist to produce a coating to protect the predetermined lead selenide pattern from etching solutions, removing the lead selenide film not protected by photoresist by alternately dipping the resulting structure in an aqueous solution of hypochlorite and an aqueous solution of peroxide, removing the chemically converted lead selenide film not protected by photoresist by contacting it with an acid dip solution, and removing the remaining protective layer of photoresist from the resulting structure to produce the desired lead selenide detector pattern.

3. A method for the production of infrared detector patterns of lead sulfide which comprises the steps of applying a film of lead sulfide to a substrate, applying a photoresist layer to the exposed lead sulfide film, applying a photomask having clear and opaque areas of the desired pattern to the photoresist layer, exposing the resulting structure to radiation through the photomask to modify the photoresist layer in clear areas of the pattern, developing the photoresist to produce a coating to protect the predetermined lead sulfide pattern from etching solutions, removing the lead sulfide film not protected by photoresist by alternately dipping the resulting structure in an aqueous solution of hypochlorite and an aqueous solution of peroxide, removing the chemically converted lead sulfide film not protected by photoresist by contacting it with a water rinse solution, and removing the remaining protective layer of photoresist from the resulting structure to produce the desired lead sulfide detector pattern.

References Cited

UNITED STATES PATENTS 3,158,517 11/1964 Schwarzenberger ------ 156—17

FOREIGN PATENTS 691,495 5/1953 Great Britain.
909,228 10/1962 Great Britain.

NORMAN G. TORCHIN, *Primary Examiner.*

R. E. MARTIN, *Assistant Examiner.*